United States Patent [19]
Hiramoto et al.

[11] Patent Number: 5,481,159
[45] Date of Patent: Jan. 2, 1996

[54] METAL VAPOR DISCHARGE LAMP

[75] Inventors: Tatsumi Hiramoto, Tokyo; Tatsushi Igarashi, Himeji; Hiromitsu Matsuno, Himeji; Yukio Yasuda, Himeji; Akiyasu Yamaguchi, Himeji, all of Japan

[73] Assignee: Ushiodenki Kabushiki Kaisha, Tokyo, Japan

[21] Appl. No.: 237,906

[22] Filed: May 4, 1994

[30] Foreign Application Priority Data

May 7, 1993 [JP] Japan ................................ 5-130103

[51] Int. Cl.$^6$ .................................................. H01J 61/12
[52] U.S. Cl. ........................... 313/570; 313/568; 313/620; 313/637
[58] Field of Search ..................... 313/570, 568, 313/620, 637

[56] References Cited

U.S. PATENT DOCUMENTS 3,706,000 12/1972 Retzer et al. ............................ 313/570
4,594,529 6/1986 De Vrijer ................................ 313/571
4,704,346 11/1987 Hiramoto et al. ...................... 313/571

Primary Examiner—Sandra L. O'Shea
Assistant Examiner—Vip Patel
Attorney, Agent, or Firm—Keck, Mahin & Cate

[57] ABSTRACT

A discharge lamp uses resonance lines which are emitted by ions in an excitation state and has a high short wave ultraviolet ray output. The lamp is provided with a pair of electrodes, having a reciprocal spacing of equal to or smaller than 12 mm, and is of the electrode-stable type. As the major emission material, cadmium is encapsulated in a quantity permitting a partial pressure P in operation of $3\times10^3$ Pa to $1.3\times10^5$ Pa. The lighting operation is performed in a state in which a lamp current $J_L$ fulfills the following condition (a):

$$0.7 < J_L/P^{1/4} < 15.0. \qquad \text{Condition (a)}$$

As an alternate major emission material, zinc can be encapsulated in a quantity permitting a partial pressure P in operation of $1\times10^3$ Pa to $0.3\times10^5$ Pa ant the lighting operation is performed in a state in which a lamp current $J_L$ fulfills the following condition (b):

$$0.7 < J_L/P^{1/4} < 16.9. \qquad \text{Condition (b)}$$

4 Claims, 1 Drawing Sheet

METAL VAPOR DISCHARGE LAMP

Background of the Invention

1. Field of the Invention

The invention relates to a discharge lamp, in which an emission or irradiation is obtained through resonance lines, which are emitted from ions in an excitation state.

2. Background of the Disclosure

Conventionally in the case of a known discharge lamp an emission through spectral lines is used, which are emitted within an arc formed between electrodes at transitions of atoms or ions from one excitation sate to another excitation state or ground state.

Resonance lines, which are among the emission spectral lines, which are emitted at transitions of atoms or ions from one excitation state into a ground state, due to their high transition probability, generally have a high radiation factor, potentially.

Lamps, whose irradiated resonance lines are short-wave ultraviolet rays, therefore have a very high industrial value. Lamps with a high output of short-wave ultraviolet rays are e.g. necessary in photochemical industries, in the manufacture of semiconductor devices, etc. There are adequate possibilities for covering such needs.

However, in the presently used discharge lamps it is considered disadvantageous that there is unavoidably a so-called self-absorption phenomenon. This means that optically-thick spectral lines such as resonance lines, which are emitted within the arc from the atoms or ions in the excitation state, are absorbed to a high degree by similar atoms or ions. These atoms or ions simultaneously coexist in a ground state. As a consequence of this the radiation light to be obtained through the resonance lanes is not radiated to the outside with a high radiation intensity from the lamp and in practice such a lamp is unusable.

For example, in the case of a mercury arc lamp of the short arc type, resonance lines with wavelength of 185 nm and 254 nm emitted by g in an excitation state within a high temperature arc are absorbed by Hg, which is present in a part having a low temperature in a periphery of the arc and is in a ground state. Therefore the resonance lines are only radiated to the outside from the lamp to a very small extent.

In the case of discharge lamps, emitted light intensity can normally be increased by raising the partial pressure of the major emission material and by increasing the temperature of the emission atoms of ions during operation. However, resonance lines can only be emitted by reducing the self-absorption phenomenon. For example, resonance lines with the wavelength 254 nm, which are emitted by Hg, only have an adequate intensity for industrial uses in the case of a mercury arc lamp with an extremely low pressure of approximately $1 \times 10^{-1}$ Pa.

Thus, for the reason indicated hereinbefore, there is neither a usable medium pressure lamp, nor a usable high pressure lamp with a suitably high output of short wave ultraviolet, rays.

SUMMARY OF THE INVENTION

The object of the invention is to provide a discharge lamp, in which it is possible to use resonance lines, which are emitted from ions in an excitation state and which have a high short wave ultraviolet ray output.

According to the invention this object is achieved in that in the case of a discharge lamp, which is provided with a pair of electrodes having a reciprocal spacing of equal to or smaller than 12 mm and whose arc is stabilized by means of the electrodes, the major emission material cadmium is encapsulated in a quantity permitting a partial pressure in an operating state of $3 \times 10^3$ Pa to $1.3 \times 10^5$ Pa and that the lamp operation is performed in a state, in which the hereinafter indicated condition (a) is fulfilled. In condition (a), the partial pressure of the above-described major emission material in operation is designated P and the lamp current $J_L$:

$$0.7 < J_L/P^{1/4} < 15.0 \qquad \text{Condition (a)}$$

In addition, the object is achieved according to the invention in that the major emission material can be zinc which is encapsulated in a quantity permitting a partial pressure in operation of $1 \times 10^3$ Pa to $0.3 \times 10^5$ Pa and the lamp operation is perfumed in a state in which the hereinafter indicated condition (b) is fulfilled. In condition (b), the partial pressure of the above-described major emission material in operation is designated P and the lamp current $J_L$:

$$0.7 < J_L/P^{1/4} < 16.9 \qquad \text{Condition (b)}$$

As a result of the above-described arrangement, in which an adequately high temperature is achieved within the arc formed between the electrodes and which is kept constant, a relatively large amount of cadmium or zinc as the major emission material is ionized within the above-described arc, so that a state is obtained in which there is a high density of cadmium ions $Cd^+$ or zinc ions $Zn^+$.

However, due to the low temperature of the above-described periphery of the arc, in the latter cadmium or zinc as the main emission material is scarcely ionized, so that a state is obtained in which there is a low density of cadmium ions $Cd^+$ or zinc ions $Zn^+$.

As a consequence of this in the case when cadmium is the major emission material resonance lines with a wavelength of 214.4 nm, which are emitted by the $Cd^+$ within the arc, are radiated to the outside from the lamp with a high intensity.

In the case that zinc is the major emission material, resonance lines with a wavelength of 202.6 nm, which are emitted by $Zn^+$ within the arc, are radiated to the outside from the lamp with a high intensity.

BRIEF DESCRIPTION OF THE DRAWINGS

Embodiments of the discharge lamp according to the invention are described in greater detail hereinafter relative to the drawings, wherein show.

DETAILED DESCRIPTION OF THE EMBODIMENT

Figure 1:
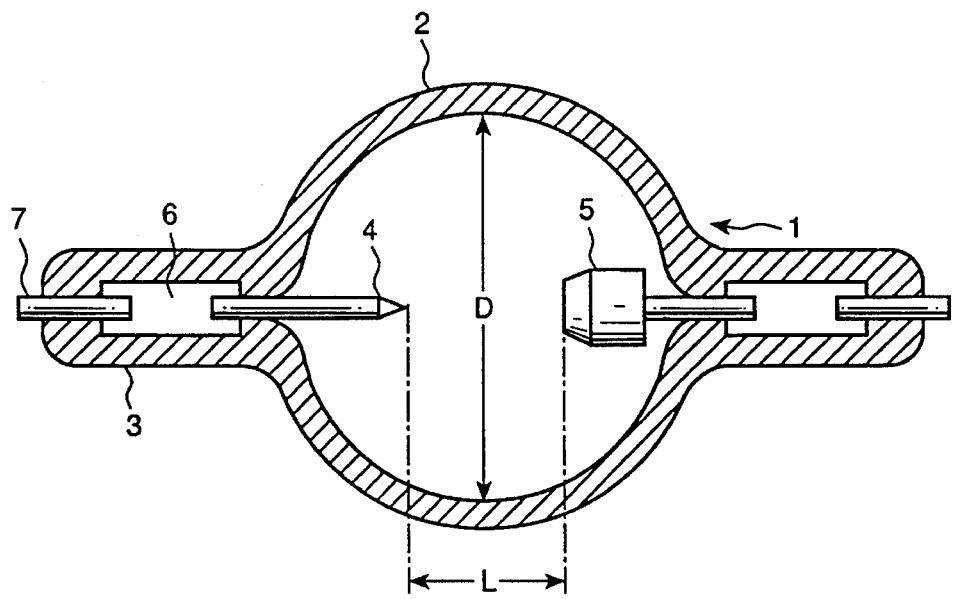
FIG. 1 a diagrammatic cross-sectional view of an embodiment of the discharge lamp according to the invention.

FIG. 1 diagrammatically shows in cross-section an embodiment of a discharge lamp according to the invention and in which a glass arc tube is designated 1. The arc tube is centrally provided with an approximately spherical enlargement 2, which has a separated inner space. On both ends of the are tube 1 is locate, a sealed portion 3. Within the inner space are positioned in facing manner a cathode 4 and an anode 5. The base of he cathode 4 and the base of the anode 5 are in each case connected to a metal foil 6 hermetically enclosed within the sealed portion 3. Each of the metal foils 6 is connected to an outer base pin 7.

This discharge tube has an arrangement as a lamp of the electrode-stable type, i.e. a lamp, whose arc is stabilized by means of the electrodes. There is a spacing L between the cathode 4 and the anode 5 equal to or smaller than 12 mm and a L/D, i.e. a ratio between the spacing between the electrodes L and a maximum internal diameter D perpendicular to the electrode direction of the envelope 2, which ie e.g. smaller than 1, and an arc state is stabilized by the electrodes.

Within the inner space subdivided by the envelope 2 is encapsulated cadmium or zinc as the major emission material. In the case that the major Mission material is cadmium, the cadmium is encapsulated in a quantity permitting a partial pressure P of the major emission material in operation of $3 \times 10^3$ Pa to $1.3 \times 10^5$ Pa and the lamp operation is performed with a lamp current $J_L$, which fulfils the following condition (a):

$$0.7 < J_L/P^{1/4} < 15.0 \qquad \text{Condition (a)}$$

In the case that zinc is the major emission material, the zinc is encapsulated in a quantity permitting a partial pressure P of the major emission material in operation of $1 \times 10^3$ Pa to $0.3 \times 10^5$ Pa and lamp operation is performed with a lamp current $J_L$, which fulfils the following condition (b):

$$0.7 < J_L/P^{1/4} < 16.9 \qquad \text{Condition (b)}$$

The cadmium or zinc is encapsulated during lamp manufacture in the case of the cadmium element as cadmium metal or cadmium halide, such as $CdI_2$ or the like or an admixture thereof, or in the case of the zinc element as zinc metal or zinc halide or an admixture thereof. If necessary, within the inner space can be encapsulated as a buffer gas rare gas, such as argon, kryton or the like, or mercury or the like.

As the lamp, in the case of the above-described arrangement, is operated at an extremely high lamp current $J_L$, an adequately high temperature is reached within the arc formed and kept constant between the cathode 4 and the anode 5. AG a consequence of this a relatively large amount of cadmium or zinc as the major emission material is ionized within the above-described arc, which leads to a state in which there is a very high density of cadmium ions $Cd^+$ or zinc ions $Zn^+$.

However, due to the above-stated operating conditions in the periphery of the arc, cadmium or zinc as the major emission material, as a result of the large temperature difference compared with that in the arc, through being stabilized by the cathode 4 and the anode 5, scarcely undergoes ionization and this leads to a state in which there is a low $Cd^+$ or $Zn^+$ density in the periphery.

Therefore the self-absorption phenomenon only rarely occurs and the lamp operation is performed in a state, in which the resonance lines, which are emitted by the $Cd^+$ or $Zn^+$ within the arc, are emitted to the outside from the lamp with a high intensity, as is made apparent from the subsequent test examples.

However, if the spacing L between the cathode 4 and the anode 5 is greater than 12 mm, a larger arc shape occurs. It is not therefore desirable to use that kind of lamp together with a focussing mirror, because then there is a reduction of the focussing efficiency.

In the case where the major emission material is cadmium and the partial pressure P rises in operation above $1.3 \times 10^5$ Pa, or in the case that the major emission material is zinc and the partial pressure P rises in operation above $0.3 \times 10^5$ Pa, there is a drop of the emission line intensity to be obtained through cadmium or zinc ions, because cadmium ions are absorbed by resonance lanes with a wavelength of 228.80 nm or zinc atoms by resonance lines with a wavelength of 213.86 nm and this takes place in a larger quantity.

If the lamp current is low and the value of the ratio $J_L/P^{1/4}$ is equal to or smaller than 0.7, nm the cadmium or zinc is not adequately ionized within the arc, because it is difficult to adequately increase the temperature within the arc. The intensity of the resonance lines radiated to the outside decreases, because the density of the $Cd^+$ or $Zn^+$ is low and at the same time the self-absorption phenomenon occurs more frequently.

In the case that the lamp current $J_L$ is high and the value of the ratio $J_L/P^{1/4}$ using cadmium as the major emission material is equal to or greater than 15.0 and using zinc as the major emission material equal to or greater than 16.9, the major temperature of the periphery of the arc also increases. Therefore the cadmium or zinc of the periphery of the arc is ionized and the resonance lines emitted within the arc by $Cd^+$ or $Zn^+$ are relatively more frequently absorbed by the $Cd^+$ or $Zn^+$ in a ground state in he arc periphery.

As described hereinbefore, as a result of the measure of fulfilling condition (a or condition (b), a high intensity and a high efficiency is achieved, so that there is a transient power of the resonance lines emitted by $Cd^+$ or $Zn^{30}$.

When performing the invention it is desirable for obtaining a state in which condition (a) or (b) is fulfilled, to operate the discharge lamp according to the invention so that it is inserted within an outer jacket tube and that cooling air layers are formed around the arc tube 1, so that there is an advantageous, high temperature within the arc.

As a result of this measure with a temperature of a wall of the arc tube i of e.g. approximately 1000 to 1200 degrees K., a stable state can be easily obtained, in which the arc center temperature is approximately 9000 to 10,000 degrees K.

For the stable maintenance of the arc state, it is also desirable to perform the lighting operation using a vertical lighting operation system, i.e. in a state in which the electrodes face one another at the top and bottom.

Hereinafter specific test examples of the invention are described. However, the invention is not restricted to the lamps described therein.

A discharge lamp A was manufactured in such a way that within an arc tube, which has a spacing L between the electrodes of 5 mm and an inner space with a volume of 22.1 cm$^3$, 28 mg of cadmium element and argon gas were encapsulated (with a pressure of 3 atm on encapsulation).

Figure 2:
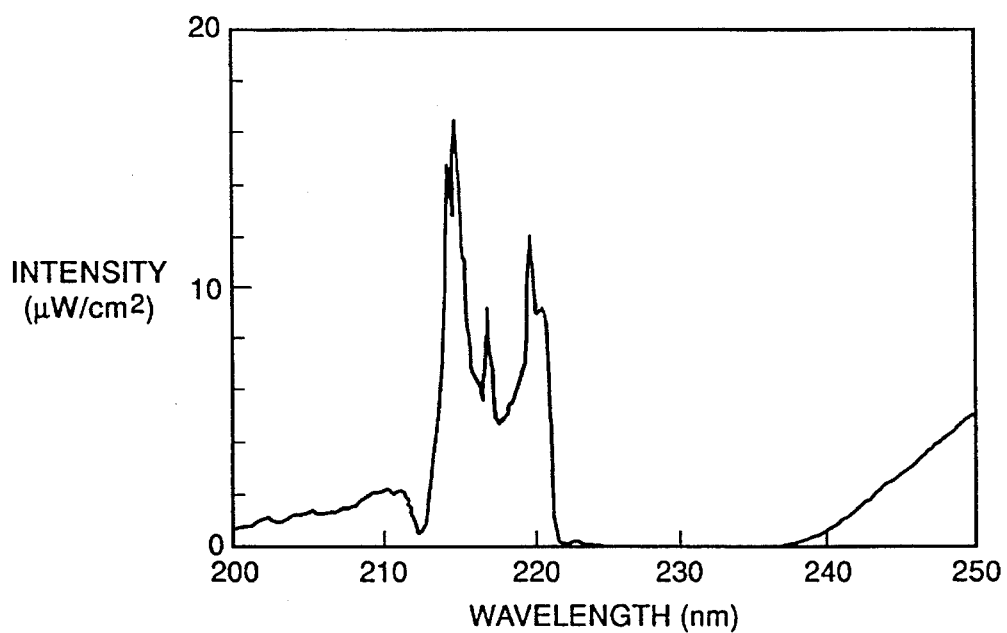
FIG. 2 a diagramm showing the spectral intensity distribution of the discharge lamp of the embodiment at wavelengths of 200 to 250 nm.

This discharge lamp was operated within an outer jacket tube using a vertical lighting operation system under the condition that the lamp current $J_L$ is 34.0 A. There is a partial pressure P of the cadmium in operation of $0.8 \times 10^5$ Pa, a ratio $J_L/P^{1/4}$ of 2.0 and a transient power Q of 693 W. With respect to the light emitted by the discharge lamp A, a spectral intensity distribution in a wavelength range 200 to 250 nm was measured. The result is shown in FIG. 2 by means of a measurement diagram or graph.

As can be gathered from the graph, resonance lines emitted by the cadmium ions $Cd^+$ at a wavelength of 214.4 nm had a very high intensity. Moreover, in the case of this lamp, spectral lines with a wavelength of 219.46 nm and other spectral lines, which is a result of an action of the above-described resonance lines as absorption lines were not radiated to the outside by known discharge lamps, were radiated with a relatively high intensity.

From the above-described graph an integrated value φ of the light intensity was emitted in a wavelength range 213 to 221 nm and a (φ/Q)×100, i.e. a ratio between said integrated value φ and the electric input power Q (φ/Q)×100 was calculated. The integrated value φ was 62.9 and there was a ratio (φ/Q)×100 at 9.08.

The above-described discharge lamps E and D were operated within an outer jacket tube using a vertical lighting operation system under the conditions represented in Table 1. With respect to the light radiated by each lamp a spectral intensity distribution in a wavelength range 200 to 250 nm was measured, on the basis of the measurement diagram obtained an integrated value φ of the light intensity in a wavelength range 213 to 221 mm was determined and a ratio between said integrated value φ and an electric input power Q (φ/Q)×100 was calculated. The result is represented hereinafter by means of Table 1.

TAB. 1

|  | Lamp current (A) | Lamp voltage (V) | Cd-pressure P (Pa) | $J_L/P^{1/4}$ | electric power Q (W) | Integrated value φ (relative value) | φ/Q × 100 |
| --- | --- | --- | --- | --- | --- | --- | --- |
| Lamp A (invention) | 34.0 | 20.4 | $0.8 \times 10^5$ | 2.0 | 693 | 62.9 | 9.06 |
| Lamp 8 (invention) | 45.0 | 15.4 | $0.6 \times 10^4$ | 8.8 | 692 | 54.6 | 7.89 |
| Lamp C (invention) | 25.5 | 14.0 | $0.5 \times 10^5$ | 1.7 | 356 | 34.9 | 9.80 |
| Lamp D (invention) | 27.0 | 11.6 | $0.4 \times 10^4$ | 3.4 | 315 | 23.3 | 7.40 |
| Lamp C (Comparison example) | 85.5 | 12.9 | $1.0 \times 10^3$ | 15.2 | 1103 | 10.8 | 0.98 |
| Lamp F (Comparison example) | 8.5 | 22.8 | $0.8 \times 10^5$ | 0.51 | 194 | 1.84 | 0.95 |

A discharge lamp B was manufactured in such a way that within an arc tube having a spacing L between the electrodes of 5 mm and an inner space with a volume of 22.1 cm³, 21 mg of cadmium element and argon gas were encapsulated (with a pressure of 3 atm on encapsulation).

A discharge lamp C was manufactured in such a way that within an arc tube having a spacing L between the electrodes of 5 mm and an inner space with a volume of 22.1 cm³, 18 mg of cadmium element and argon gas were encapsulated (with a pressure of 3 atm on encapsulation).

A discharge lamp D was manufactured in such a way that within an arc tube having a spacing L between the electrodes of 5 mm and an inner space with a volume of 22.1 cm³, 1.4 mg of cadmium element and argon gas were encapsulated (with a pressure of 3 atm on encapsulation).

The above-described discharge lamps B to D were operated within an outer jacket tube using a vertical lighting operation system under the conditions represented in Table 1. With respect to the light radiated by each lamp spectral intensity distribution in a wavelength range 200 to 250 nm was measured, on the basis of the measurement diagram obtained an integrated value φ of the light intensity in a wavelength range 213 to 221 nm was determined and a ratio between said integrated value φ and the electric input power Q (φ/Q)×100 was calculated. The result is shown hereinafter by means Of Table 1.

A discharge lamp was manufactured in such a way that within an arc tube having a spacing L between the electrodes of 5 mm and an inner space with a volume of 22.1 cm³, 0.23 mg of cadmium element and argon gas were encapsulated (with pressure of 3 atm during encapsulation).

A discharge lamp F was manufactured in such a way that within an arc tube having a spacing L between the electrodes of 5 mm and an inner space with a volume of 22.1 cm³, 35 mg of cadmium element and argon gas were encapsulated (with a pressure of 3 atm on encapsulation).

As can be gathered from Table 1, lamps A to D, in which the partial pressure P of the major emission material in operation and the ratio $J_L/P^{1/4}$ fulfil the above conditions; there was a high output of ultraviolet rays in the wavelength range 213 to 221 nm and at the same time a high electric input power efficiency.

A discharge lamp G was manufactured in such a way that within an arc tube having a spacing L between the electrodes of 5 mm and an inner space with a volume of 22.1 cm³, 7 mg of zinc element and argon gas were encapsulated (with a pressure of 3 atm on encapsulation).

This discharge lamp G was operated within an outer jacket tube using a vertical lighting operation system and under a condition whereby the lamp current $J_L$ was 41 A. The partial pressure P of the zing in operation was $6 \times 10^4$ Pa, the ratio $J_L/P^{1/4}$ was 2.6 and the electric input power Q was 575 W. With respect to the light radiated by the discharge lamp G a spectral intensity distribution in a wavelength range 200 to 350 nm was measured, on the basis of the measuring diagram an integrated value φ of the light intensity in a wavelength range 201 to 208 nm was determined and a ratio between said integrated value φ and the electric input power Q (φ/Q)×100 was calculated. The integrated value φ was at 28.5 and the ratio (φ/Q)×100 at 5.0.

Effect of the Invention

According to the invention resonance lines emitted by ions within an arc have a high intensity due to a high density of the above-described ions within the arc and at the same time, due to a low density of the ions in the periphery of the arc are emitted to the outside by the lamp with a high intensity. Thus, the invention provides a discharge lamp having a high short wave ultraviolet ray output and having high radiance.

It is to be understood that although preferred embodiments of the invention have been described, various other embodiments and variations may occur to those skilled in the art. Any such other embodiments and variations which fall within the scope and spirit of the present invention are intended to be covered by the following claims.

What we claim is:

1. A metal vapor discharge lamp comprising:

a pair of electrodes having a reciprocal spacing no larger than 12 mm and stabilizing an arc of said lamp, and means for encapsulating cadmium, as a major emission material, in a quantity resulting in a partial pressure, in operation, of $3\times10^3$ Pa to $1.3\times10^5$ Pa, lamp operation being performed in a state in which $0.7<J_L/P^{1/4}<15.0$, wherein P represents a partial pressure of the cadmium and $J_L$ represents a lamp current.

2. A metal vapor discharge lamp comprising:

a pair of electrodes having a reciprocal spacing no larger than 12 mm and stabilizing an arc of said lamp, and means for encapsulating zinc, as a major emission material, in a quantity resulting in a partial pressure, in operation, of $1\times10^3$ Pa to $0.3\times10^5$ Pa, lamp operation being performed in a state in which $0.7<J_L/P^{1/4}<16.9$, wherein P represents a partial pressure of the zinc and $J_L$ represents a lamp current.

3. A lamp operation method comprising the steps of:

providing a metal vapor discharge lamp with a pair of electrodes having a reciprocal spacing no larger than 12 mm, stabilizing an arc of said metal vapor discharge lamp by the electrodes, encapsulating cadmium, as a major emission material, in a quantity resulting in a partial pressure, in operation, of $3\times10^3$ Pa to $1.3\times10^5$ Pa, and controlling a lamp current such that $0.7<J_L/P^{1/4}<15.0$, wherein P represent, s a partial pressure of the cadmium and $J_L$ represents the lamp current.

4. A lamp operation method comprising the steps of:

providing a metal vapor discharge lamp with a pair of electrodes having a reciprocal spacing no larger than 12 mm, stabilizing an arc of said metal vapor discharge lamp by the electrodes, encapsulating zinc, as a major emission material, in a quantity resulting in a partial pressure, in operation, of $1\times10^3$ Pa to $0.3\times10^5$ Pa, and controlling a lamp current such that $0.7<J_L/P^{1/4}<16.9$, wherein P represents a partial pressure of the zinc and $J_L$ represents the lamp current.

* * * * *